United States Patent [19]
Kamasz et al.

[11] Patent Number: 5,585,652
[45] Date of Patent: Dec. 17, 1996

[54] METHOD AND APPARATUS FOR REAL-TIME BACKGROUND ILLUMINATION SUBTRACTION

[75] Inventors: Stacy R. Kamasz, Waterloo; Fred S. F. Ma, Scarborough, both of Canada; Michael G. Farrier, Redwood Shores, Calif.; Mark P. Bendett, Ann Arbor, Mich.

[73] Assignees: Dalsa, Inc., Waterloo, Canada; Imra America, Inc., Ann Arbor, Mich.

[21] Appl. No.: 328,921

[22] Filed: Oct. 25, 1994

[51] Int. Cl.$^6$ .................. H01L 27/148; H01L 29/768; H04N 9/64; H03K 23/46

[52] U.S. Cl. .................. 257/231; 257/223; 257/233; 257/239; 257/234; 257/229; 348/243; 348/245; 348/250; 377/58; 377/57; 377/61; 377/62; 377/63

[58] Field of Search ................. 257/229, 223, 257/234, 239, 231, 233; 348/243, 245, 250; 377/58, 57, 61, 62, 63

[56] References Cited

U.S. PATENT DOCUMENTS

| | | | |
|---|---|---|---|
| 3,940,602 | 2/1976 | Lagnado et al. | 235/181 |
| 4,064,533 | 12/1977 | Lampe et al. | 358/105 |
| 4,336,557 | 6/1982 | Koch | 358/213 |
| 4,476,568 | 10/1984 | Prince | 377/60 |
| 4,593,303 | 6/1986 | Dyck et al. | 357/24 |

FOREIGN PATENT DOCUMENTS

| | | | |
|---|---|---|---|
| 52-18125 | 2/1977 | Japan | 257/234 |
| 61-288465 | 12/1986 | Japan | 257/234 |
| 62-113472 | 5/1987 | Japan | 257/234 |

OTHER PUBLICATIONS

"Charge Transfer Devices", Carlo H. Sequin et al., Academic Press, Inc., 1975, Title page and Table of Contents and pp. 12–13, 163–164.

*Primary Examiner*—Sara W. Crane
*Assistant Examiner*—Alice W. Tang
*Attorney, Agent, or Firm*—Burns, Doane, Swecker & Mathis, LLP

[57] ABSTRACT

The present invention is directed to methods and apparatus for accurately detecting light energy of a signal of interest (e.g., a laser pulse) even when the signal-to-noise ratio is relatively low. The present invention is further directed to accurate detection of a signal of interest even when either or both the signal of interest and background illumination vary across plural pixels of an imaging an array. For example, a signal of interest can be accurately detected even in the presence of pixel response non-uniformity and fixed pattern noise, or when the incident signal of interest is not confined laterally to a single pixel.

16 Claims, 10 Drawing Sheets

5,585,652

METHOD AND APPARATUS FOR REAL-TIME BACKGROUND ILLUMINATION SUBTRACTION

BACKGROUND OF THE INVENTION

1. Field of the Invention

The present invention relates generally to methods and apparatus for sensing light energy using light sensitive devices such as charge-coupled device imaging arrays (CCD), and in particular to methods and apparatus for accurately detecting light signals under conditions where low signal-to-noise ratios exist (e.g., relatively low optical power received within relatively short time intervals in the presence of ambient illumination).

2. State of the Art

Devices and systems for detecting transmitted light energy are relatively well known and are used, for example, in laser radar systems. In laser radar systems a reflected pulse of light energy (e.g., laser pulse) is detected by a light sensitive device (e.g., charge-coupled device imaging array). The lateral position of the detected pulse on an array of the charge-coupled device can be used to provide information regarding the position of an object which reflected the pulse. However, conventional light signal detection devices often encounter difficulty in accurately detecting the reflected laser pulse when its total energy is relatively low in comparison with unwanted ambient illumination which is accumulated by the imaging array along with the laser pulse energy.

Ambient illumination caused by any natural or artificial light source in a vicinity of the imaging array can produce background noise. For example, ambient illumination due to sunlight, room light or shot noise from the laser pulse emission, can produce background illumination. As the relative energy of the reflected laser pulse (i.e., determined by optical power and pulse duration) is decreased, conventional detection devices have difficulty distinguishing the laser pulse from background illumination. Because background illumination is continuous and generally non-uniform across imaging array, small fluctuations in the background illumination can be improperly detected as the laser pulse. Further, large fluctuations in background which occur slowly over time with respect to the laser pulse duration (e.g., background fluctuations on the order of milliseconds relative to laser pulse durations on the order of nanoseconds) can result in mischaracterization of background noise as the incident signal.

Conventional techniques for discriminating background illumination from the laser pulse typically acquire an accumulated first signal from the imaging array which represents a combination of the laser pulse superimposed on the background illumination. Either prior to or soon after acquiring the superimposed signal, a second signal can be obtained from the detection device which represents only the background illumination. The second signal representing background illumination can then be subtracted from the first signal in a differential amplifier which is independent of the imaging array, leaving a differential signal assumed to be proportional to the laser pulse energy.

Co-pending U.S. application Ser. No. 08/012,869, and entitled "Dual Mode On-Chip High Frequency Output Structure With Pixel Video Differencing For CCD Image Sensors", Chamberlain et al, the disclosure of which is hereby incorporated by reference in its entirety, describes an output amplifier for use in conjunction with a charge-coupled device to differentially combine a first superimposed laser pulse/background illumination signal and a second background illumination signal. The output amplifier can provide a difference signal without adding complexity to the signal processing scheme of conventional techniques. If the incident light from a laser pulse is confined laterally to a first pixel "n" in a charge-coupled device array, a floating gate amplifier can subtract the background illumination accumulated in a second, separate pixel immediately adjacent the first pixel (i.e., pixel "n −1" or pixel "n +1") thereby leaving only the charge associated with the laser pulse.

Conventional techniques for discriminating a signal of a interest (e.g., laser pulse) from background illumination do not fully address all conditions which affect signal-to-noise ratio. For example, such techniques operate on the assumption that background illumination will not have changed substantially between times at which the first and second signals were acquired (e.g. it is assumed that shot noise due to emission of the laser pulse is negligible). Regardless of whether digital or analog signal processing is used, high-speed electronics required to process the acquired data produce additional system noise which further degrades signal-to-noise ratios.

In addition, conventional techniques do not account for background illumination which is non-uniform across pixels of the charge-coupled device array (e.g., sharp variations in background illumination from pixel to pixel can be falsely detected as a laser pulse). Other factors which can produce non-uniform background illumination from one pixel to another include non-uniform characteristics of the pixels themselves. For example, pixel response non-uniformity (PRNU) or fixed pattern noise (FPN) can cause pixels to produce different electrical signal outputs in response to the same level of illumination). Because signals of interest are not necessarily confined laterally to a single pixel, the effects of pixel response non-uniformity and fixed pattern noise, or the existence of large variations in the background illumination, can result in ambiguous signal detection which becomes aggravated as the signal-to-noise ratio is further degraded.

FIG. 1A illustrates a detection device 100 having an imaging region 118 with four pixels represented as photoelements 110, 112, 114, and 116. The imaging region 118 can be, for example, a full frame, frame transfer, interline transfer (ILT), time-delay and integration (TDI), or frame interline transfer imaging region. Below the imaging region 118 is a horizontal charge-coupled device (HCCD) 120 comprising three-phase stages 122, 124, 126 and 128 for reading-out accumulated photocharge from the photoelements. Those skilled in the art will appreciate that a three-phase stage is a set of three contiguous gates, with a stage being the smallest set of independent horizontal charge-coupled device gates. Because a separate three-phase stage is provided for each photoelement, the lateral pitch of the horizontal charge-coupled device 120 can be considered equal to that of the imaging region 118.

The FIG. 1A detection device further includes an independent output amplifier 130 separate from the imaging region and horizontal charge-coupled device. The output amplifier 130 can obtain a difference between two separate, spatially adjacent photocharge packets stored in adjacent three-phase stages of the horizontal charge-coupled device 120. A laser pulse having an energy "L" is laterally confined to photoelement 112, while a non-uniform background illumination "B" in each of the four photoelements is illustrated by the different background illuminations B1, B2, B3 and B4 in each of the four pixels illustrated. Those skilled in the art will appreciate that the variation in background illumination for each of the pixels of FIG. 1A can, for example, be attributed to non-uniform pixel response, fixed pattern noise, variation in background illumination, or any combination of two or more of these effects. It is further assumed in the FIG. 1A example that the photocharge created by the laser pulse illumination on the photoelement 112 is less than or comparable in magnitude to fluctuations of the background illumination present in each of the pixels.

The output amplifier 130 provides: (1) a first difference between photocharge accumulated in a first pixel 116 and a reset level of the amplifier (i.e., zero amplitude); (2) a second difference between photocharge in the pixels 114 and 116; (3) a third difference between photocharge in the pixels 112 and 114; and (4) a fourth difference between photocharge in the two separate pixels 110 and 112. Thus, conventional imaging arrays cannot accurately detect the existence of photocharge due to the laser pulse in the pixel 112 because the laser pulse energy in combination with the background illumination B3 is comparable to the photocharge accumulated in the remaining pixels. Further, variations in the background illumination at a given pixel may be falsely identified as a laser pulse. Thus, poor signal-to-noise performance can inhibit signal detection.

FIG. 1B illustrates a situation where: B2 is less than B1; (L+B3) is greater than B2; and B4 is greater than (L+B3). The output amplifier 130 will produce four differential values labelled 1–4 in FIG. 1B. However, the imaging array would be unable to distinguish the differential value 3 from the differential value 4. Further, differential value 1 would be significantly greater than either of differential values 3 or 4. Thus, the imaging array 100 would be unable to distinguish the existence of a laser pulse in pixel 112 of FIG. 1A, and may falsely indicate the existence of a laser pulse in pixel 116.

FIGS. 1C and 1D illustrate an aggravated condition which can exist using conventional charge-coupled device imaging arrays when the laser pulse is not confined to a single pixel. As illustrated in FIG. 1C, laser energy L1 from a given laser pulse is incident on pixel 114 (FIG. 1A), laser energy L2 from the same laser pulse is incident on pixel 112 and laser energy L3 from the laser pulse is incident on pixel 110, the laser pulse lateral spatial profile being assumed gaussian. The laser energy is illustrated in FIG. 1C as being superimposed on non-uniform background illumination values B1, B2, B3 and B4 with respect to each of the pixels illustrated. As a result, several smaller intensity photocharge packets of laser energy are distributed in more than one pixel, thereby aggravating the detrimental affects of pixel response non-uniformity, pixel fixed pattern noise and variations in background illumination. Consequently, the output amplifier 130 will produce differential outputs as illustrated in FIG. 1D, wherein the laser pulse intensity differential between adjacent pixels is relatively small such that the laser pulse is not readily detectable.

SUMMARY OF THE INVENTION

The present invention is directed to methods and apparatus for accurately detecting light energy of a signal of interest (e.g., a laser pulse) even when the signal-to-noise ratio is relatively low. The present invention is further directed to accurate detection of a signal of interest even when either or both the signal of interest and background illumination vary across plural pixels of an imaging array. For example, a signal of interest can be accurately detected even in the presence of pixel response non-uniformity and fixed pattern noise, or when the incident signal of interest is not confined laterally to a single pixel.

Exemplary embodiments of the present invention relate to a method and apparatus for detecting a pulse of light energy by accumulating photocharge in at least one pixel at a first sample time, said at least one pixel also accumulating a second photocharge at a second sample time, storing said first photocharge and said second photocharge, and differentially combining said first photocharge and said second photocharge to detect said pulse of light energy. In accordance with exemplary embodiments, a photocharge accumulating means, a storing means and a differential combining means can be formed on a single substrate to improve signal-to-noise ratios and reduce off-chip processing.

Exemplary methods in accordance with the present invention include the steps of accumulating photocharge in at least one pixel, transferring photocharge from the one pixel to a first stage of a storage device having plural stages, transferring said photocharge from said first stage of said storage device to a second stage of said storage device, and combining photocharge stored in said second stage with a second photocharge accumulated by said at least one pixel.

BRIEF DESCRIPTION OF THE DRAWINGS

The present invention can be further understood with reference to the following description and the appended drawings, wherein like elements are provided with the same reference numerals. In the drawings.

DETAILED DESCRIPTION OF THE PREFERRED EMBODIMENT

Figure 1A:
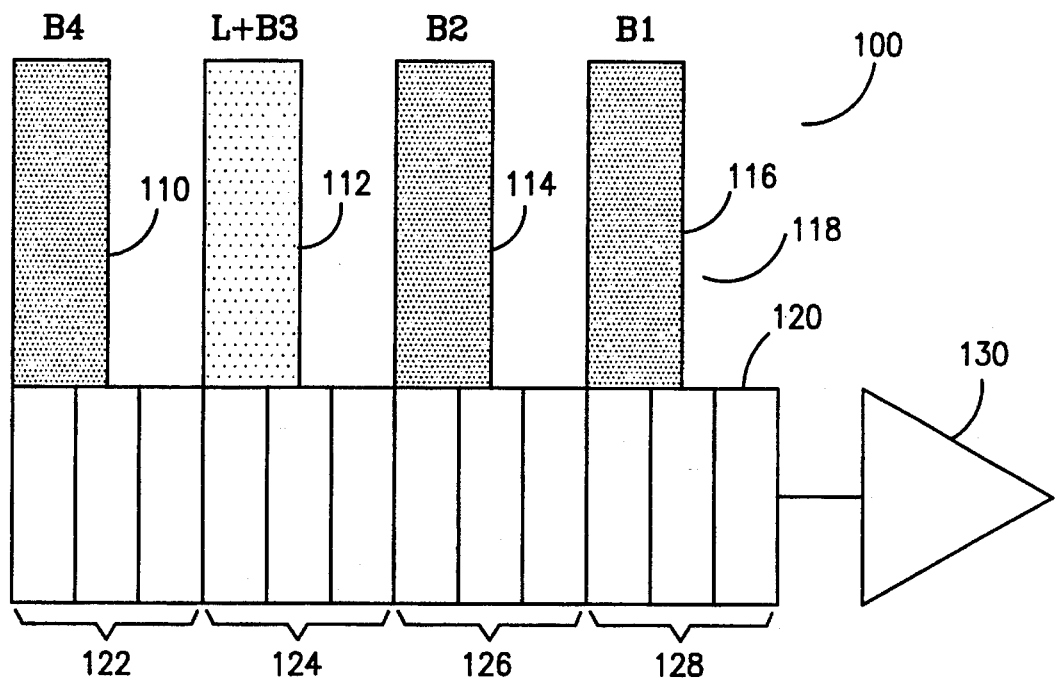
FIGS. 1A–1D show a conventional charge-coupled device imaging array, and differential outputs generated by the FIG. 1A imaging array.
Figure 1B:
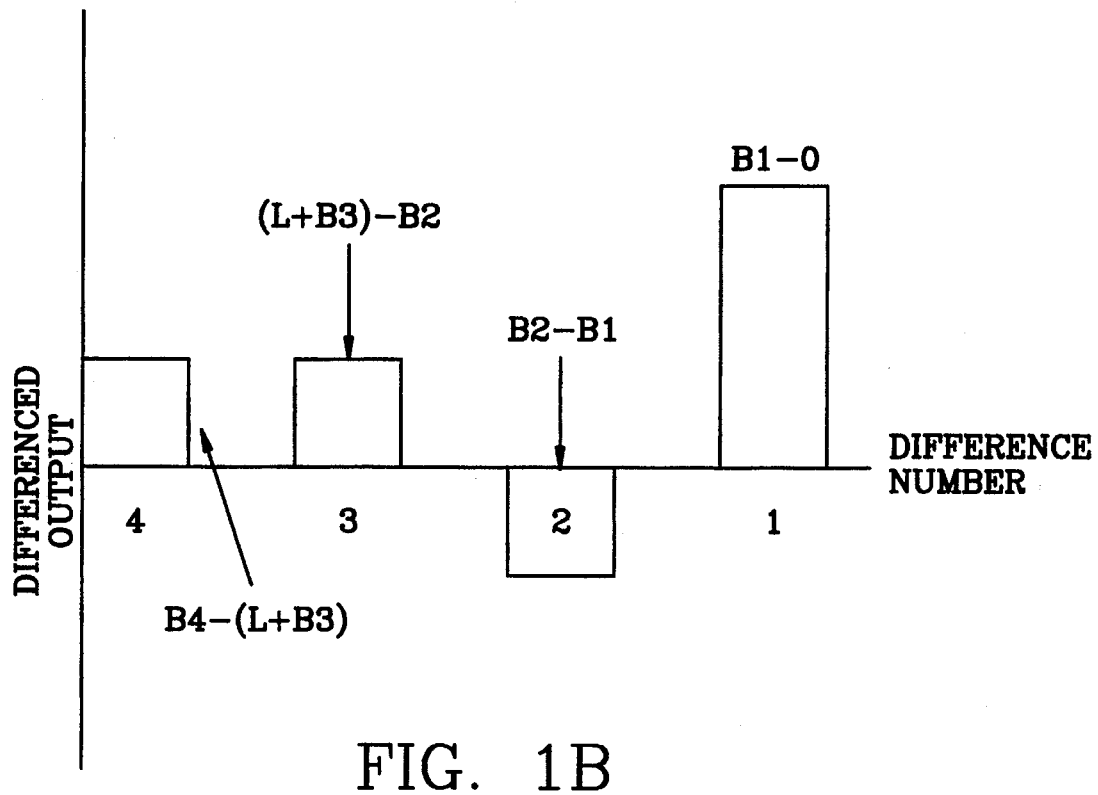
Figure 1C:
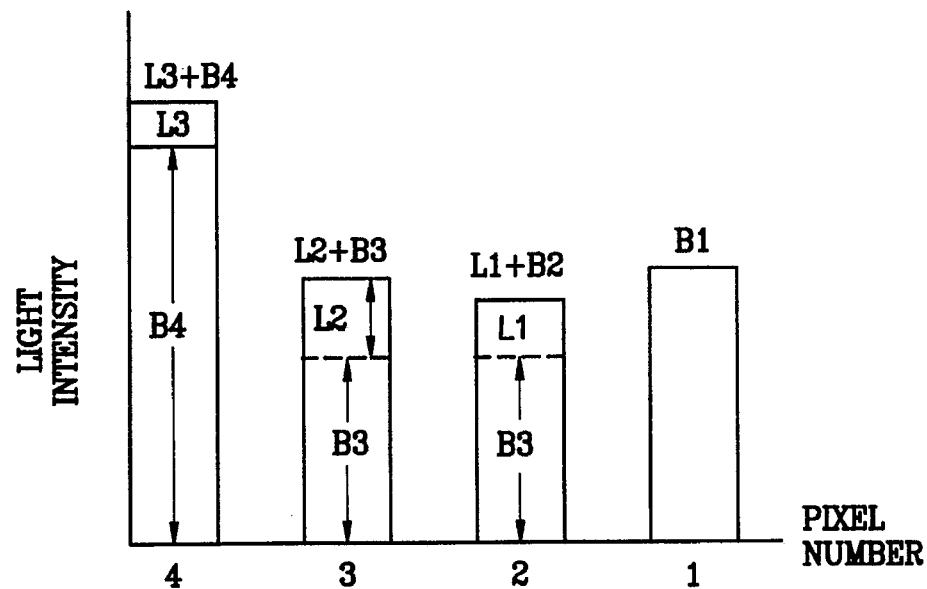
Figure 1D:
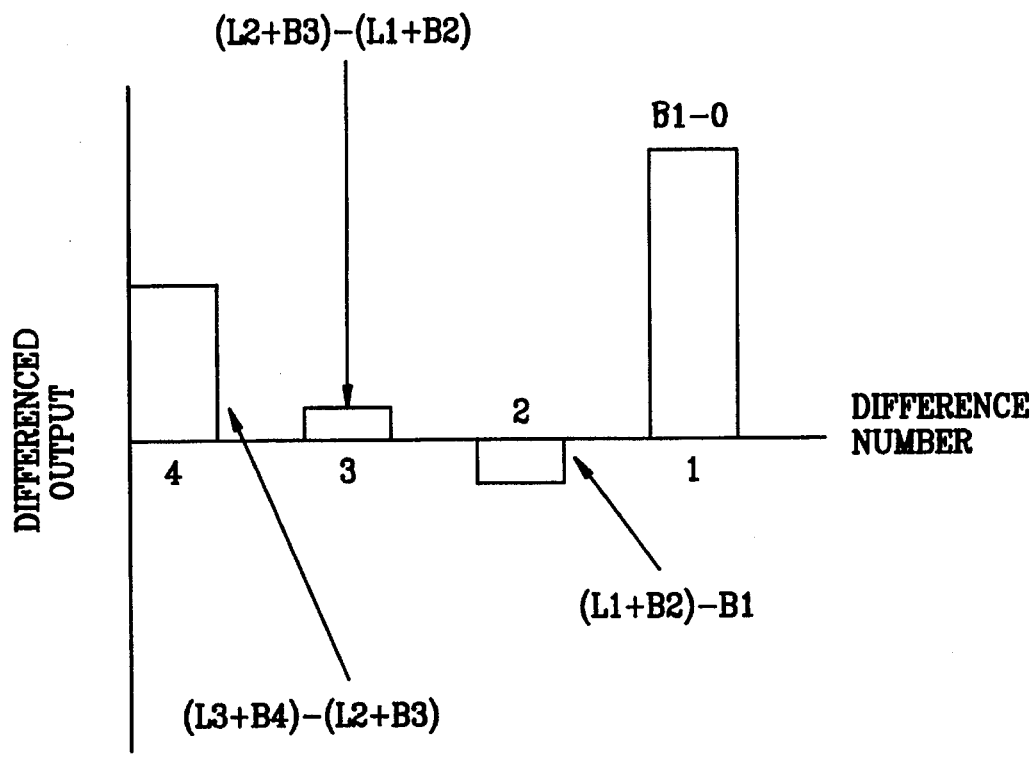
Figure 2:
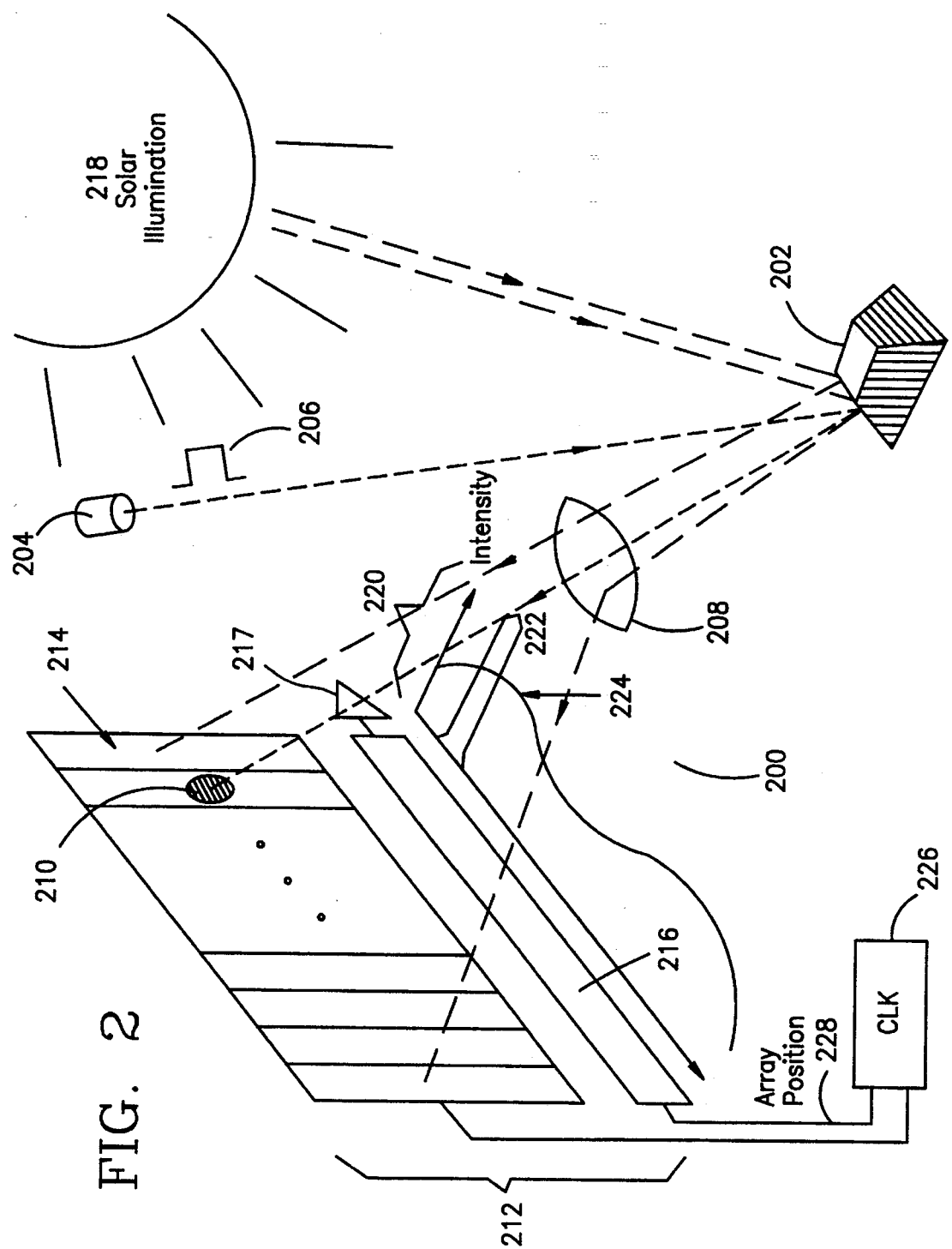
FIG. 2 shows an exemplary laser radar system which can include a detection device in accordance with the present invention.

FIG. 2 shows an exemplary system, such as a laser radar system 200 for detecting an object, such as a reflector 202, using light energy in accordance with an exemplary embodiment of the present invention. The laser radar system includes a means for emitting light energy, represented as a laser diode 204. The laser diode 204 emits a signal of interest represented as a monochromatic laser pulse 206 which is reflected by reflector 202. In accordance with exemplary embodiments, the reflector 202 can be any target, including both cooperative targets (e.g., highly reflective surfaces), semi-cooperative targets (e.g., moderately reflective surfaces such as automotive taillight assemblies) or uncooperative targets (e.g., high light absorbent targets, such as a person).

Laser radar system 200 also includes means for detecting light energy emitted from the laser diode 204. For example, an exemplary detecting means includes means for focusing pulsed light energy reflected from reflector 202, such as an optical system 208. The optical system can include one or more lenses for focusing reflected light energy from the reflector as a return spot 210 on a focal plane of an imaging array 212 in the light energy detecting means.

Those skilled in the art will appreciate that the exemplary FIG. 2 embodiment, when configured as a laser radar system, can be used to detect both range and orientation (i.e., angle relative to a reference plane) of the reflector. For example, in addition to detecting position of an object in a manner as described above, other known techniques of position detection can be used in accordance with the exemplary FIG. 2 embodiment including, but not limited to, triangulation. Those skilled in the art will appreciate that triangulation is a well known technique whereby a collimated beam emitted from laser diode 204 is focused on the focal plane of imaging array 212 after reflection by reflector 202. The lateral position of the return spot 210 on the focal plane is a function of relative position of laser emitter 204 and reflector 202.

In accordance with an exemplary embodiment, the imaging sensor 212 can be a linear charge-coupled device which includes an array of pixels 214, each pixel having one or more photoelements for accumulating photochargeo The pixels 214 can be any device capable of storing light energy (i.e., photocharge) and outputting an electrical signal proportional to the stored light energy, including but not limited to, n- photodiodes, n- pinned photodiodes, time-delay and integration (TDI) photogates, and interline transfer (ILT) type pixels. By detecting the pixel upon which a reflected light signal of interest (i.e., reflected laser pulse 206) is incident, a lateral position of the reflected pulse on the focal plane of imaging array 212 can be determined and used to detect the position and physical detail of the reflector 202.

The exemplary light energy detecting means further includes means, such as a storage device having a plurality of stages for storing photocharge which has been accumulated by the pixels 214 and transferred to the storage device. In accordance with exemplary embodiments, the storage device can be a horizontal charge-coupled device 216 for transferring (i.e., read-out) stored photocharge to a photocharge combining means represented in an exemplary embodiment as a read-out amplifier 217o Ambient background illumination, which can include sunlight or light from any other natural or artificial source (i.e., any light energy other than that which is emitted by the laser diode 204, with the exception of shot noise), is represented in FIG. 2 as solar illumination 218. Because light from the ambient illumination is also reflected by reflector 202, it is focused by the optical system 208 onto the focal plane of image sensor 212. A spatial variation of light across the image sensor 212 is illustrated graphically in FIG. 2 with a graphical plot 220 of optical power incident on each pixel at a given instant in time (y-axis) versus spatial position along an x-axis of the array. A superposition of the reflected light energy 222 due to the laser pulse emitted from the laser diode 204 and the reflected background illumination 224 from ambient sources is incident on the focal plane of the imaging array 212 as represented by the plot 220.

The FIG. 2 exemplary embodiment further includes a clocking means 226 for clocking the array of pixels in the image sensor 212 to transfer the first photocharge accumulated in at least one pixel of the image sensor 212 to a first stage of the storage device 216. Similarly, the clock signal used to perform this transfer can be used to transfer photocharge from each of the remaining pixels to different stages of the storage device. The clocking means further includes a means, represented as signal line 228 for clocking the storage device 216 to transfer the first photocharge stored in a stage of the storage device to a second stage of at least two stages associated with each pixel.

Figure 3A:
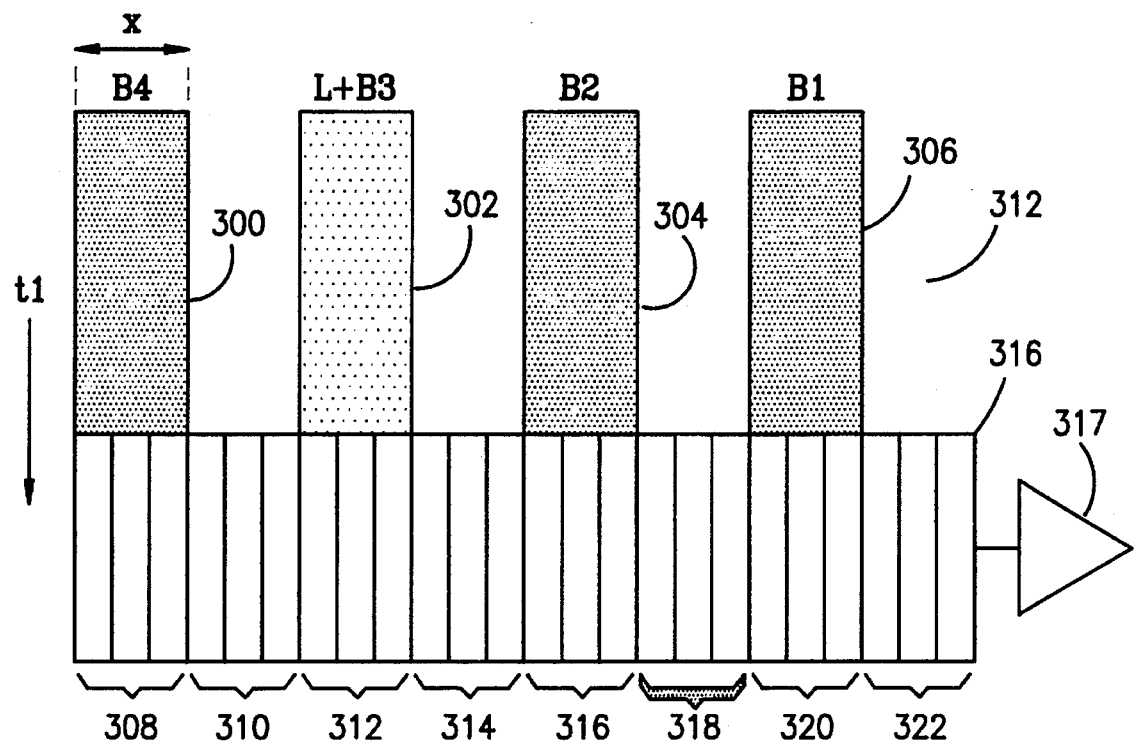
FIGS. 3A–3G show an imaging array in accordance with an exemplary embodiment of the present invention, and differential outputs generated by the FIG. 3A imaging array.

FIG. 3A illustrates an exemplary embodiment of an image sensor 312 and horizontal charge-coupled device 316 for detecting low energy light signals of interest (e.g., laser pulses) even under conditions of low signal-to-noise ratios (e.g., detection of low intensity, short time interval laser pulse even in the presence of relatively high background illumination).

In the exemplary FIG. 3A embodiment, pixels of the image sensor 312 are formed along a first axis (e.g., along a length "x") with a first pitch, while stages of the storage device 316 are formed along a second axis with a second pitch equal to one-half of the first pitch. That is, horizontal charge-coupled device 316 is three-phase, with a pitch reduced to half that of the image sensor 312. An extra stage in the horizontal charge-coupled device 316 is provided between each of the pixels 300, 302, 304 and 306. Thus, the horizontal charge-coupled device 316 includes at least two stages for each of the pixels 300, 302, 304 and 306. The 25 stages of the charge-coupled device 316 are labelled 308–322.

In accordance with exemplary embodiments, the image sensor 312 includes the pixels 300–306, each of which accumulates a first photocharge at a first sample time and accumulates a second photocharge at a second sample time. For each of the pixels 300–306, one of the at least two stages associated therewith stores the first photocharge and another of the at least two stages stores the second photocharge. The light energy detecting means as illustrated in FIG. 3A includes a photocharge combining means represented as output amplifier 317. The output amplifier can then be used to differentially combine said first photocharge and said second photocharge stored in the at least two stages of the horizontal charge-coupled device 316 with respect to a given pixel.

A cycle for providing differential outputs from the output amplifier 317 will now be described. At a time t1, a laser pulse L illuminates pixel 302 Background illumination B1, B2, B3 and B4 is also incident on the image sensor 312 and is non-uniform with respect to pixels 302–306, respectively.

Figure 3B:
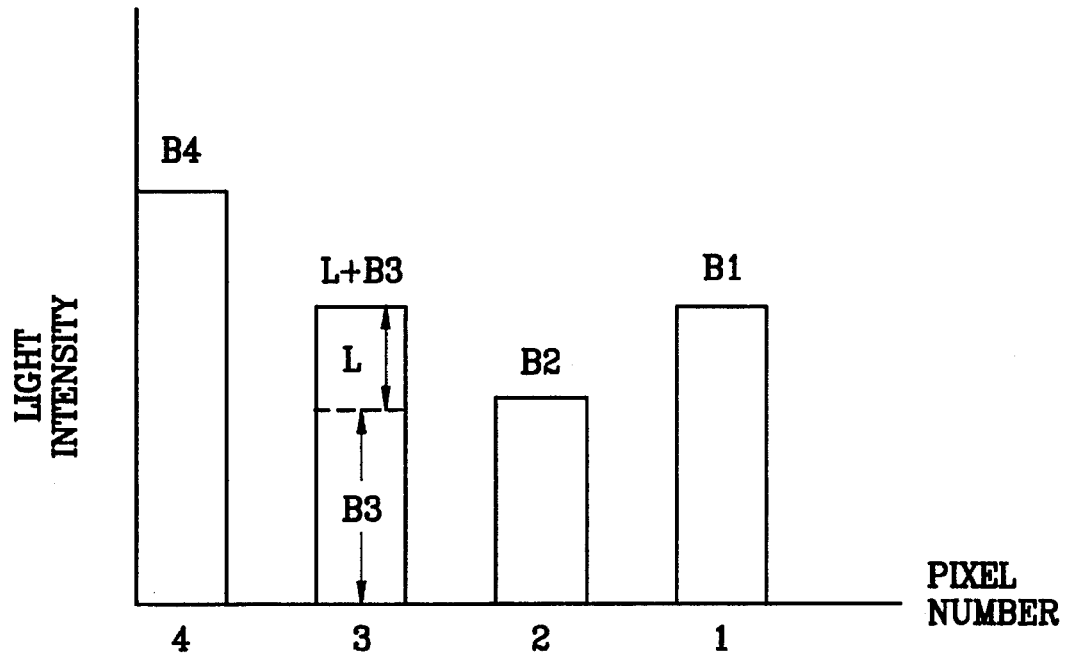
Figure 3C:
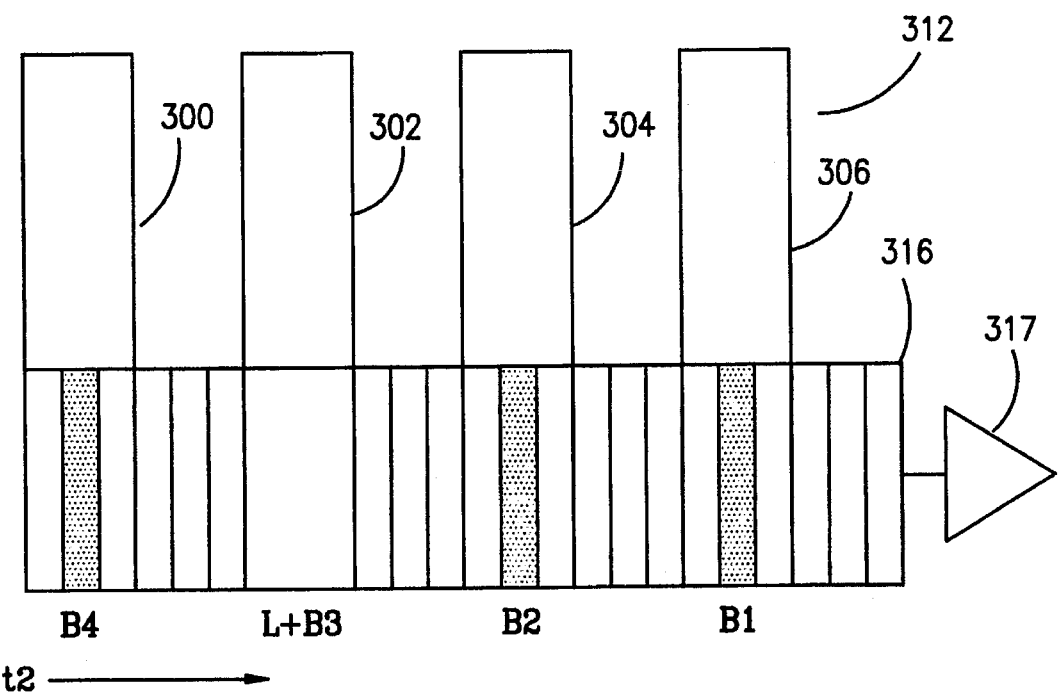
Figure 3D:
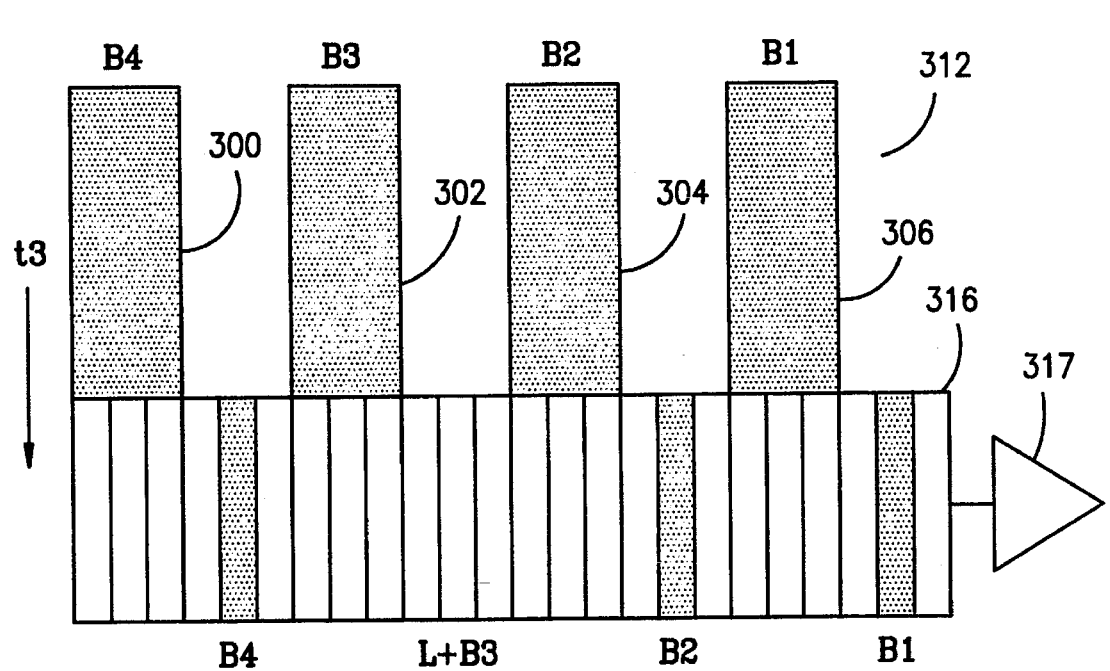
Figure 3E:
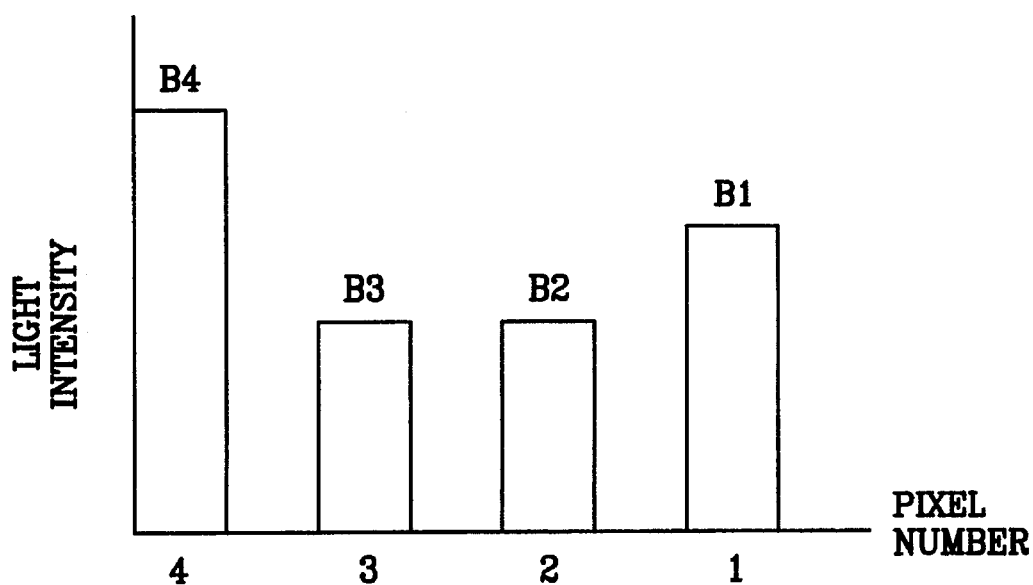

Having accumulated photocharge in each of the pixels 300–306 in FIG. 3A at time t1 (i.e., representing a first frame of photocharge), the photocharges from each pixel, as illustrated in FIG. 3B, are transferred to the horizontal charge-coupled device 316 at time t2 as illustrated in FIG. 3C. At time t3, the photocharge stored in a first stage of the horizontal charge-coupled device associated with each pixel is laterally transferred to an adjacent second stage of the horizontal charge-coupled device as illustrated in FIG. 3D. In an exemplary embodiment, this transfer direction can be towards the output, at a time when the laser pulse has expired but during which background illumination is still present. As illustrated in FIG. 3E, it is assumed that background illumination has not changed substantially from time t1 to time t3.

Figure 3F:
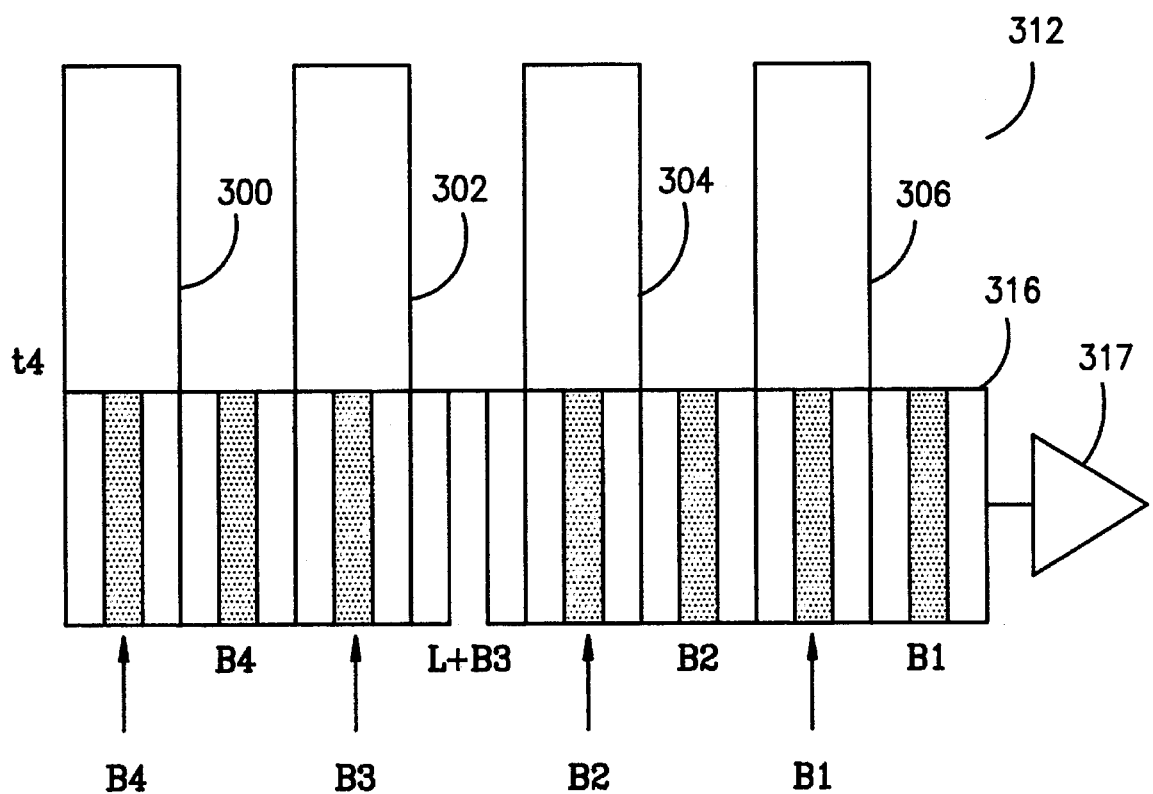

As illustrated in FIG. 3F, a second set of photocharge is accumulated in each of the pixels 300–306 and at time t4

(i.e., a second frame of photocharge) is transferred into the horizontal charge-coupled device 316. Each photocharge packet stored in the first stage of the horizontal charge-coupled device 316 (i.e., the first stage associated with each pixel) from the first frame at time t1 is followed by a photocharge packet from the second frame at time t3.

Figure 3G:
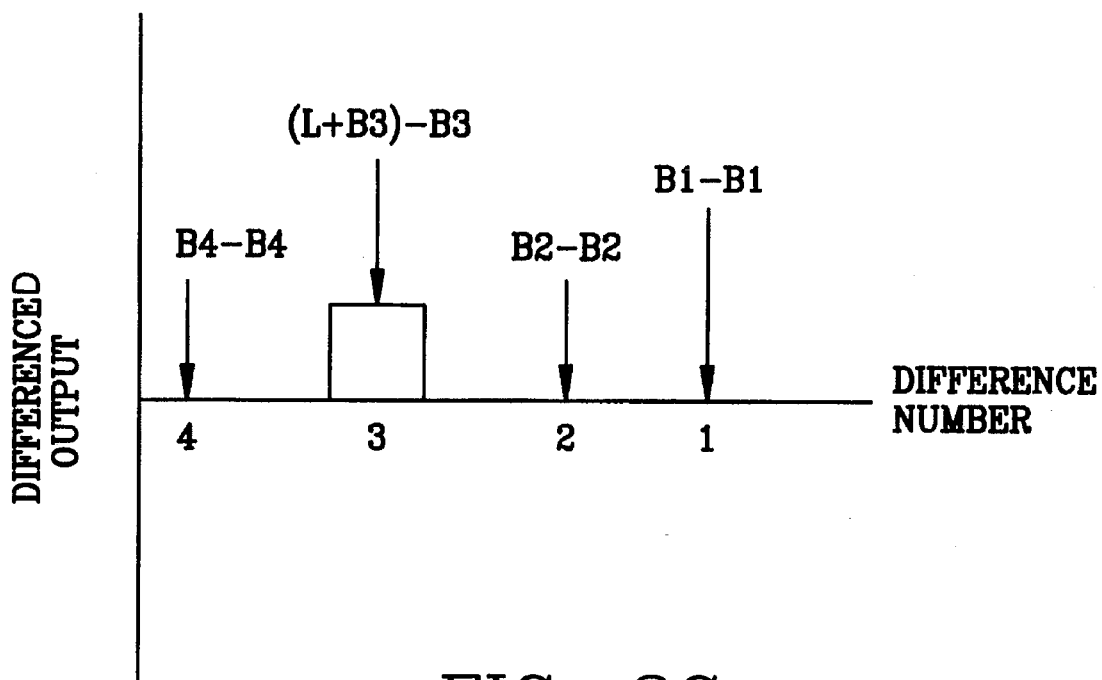

The photocharge stored in each of the first and second stages of the horizontal charge-coupled device for each pixel can then be read out to the differential output amplifier as illustrated in FIG. 3G. Assuming that the background illuminations B1–B4 are relatively constant from time t1–t3, a differential output produced by the output amplifier will provide differential signals indicative of photocharge differences between the two frames of photocharge accumulated by each pixel (i.e., the laser pulse L).

Those skilled in the art will appreciate that the foregoing method and apparatus for detecting incident signal light associated with a laser pulse is by way of example only. For example, those skilled in the art will appreciate that other embodiments can be implemented. In accordance with one alternate embodiment, the first frame of photocharge packets shifted to the right in FIG. 3D can be shifted to the left. However, by shifting the photocharge packets toward the output amplifier 317 in FIG. 3D, each photocharge packet travels a shorter distance to the output amplifier and therefore requires less transfers. This can result in a faster read-out time and a higher charge transfer efficiency. In addition, by transferring charge packets to the right of FIG. 3D, both the first and second photocharge packets associated with the at least two stages of the storage device for a given pixel will travel through exactly the same charge-coupled device gates. Thus, the charge packets will be affected in the same way by the same gates, and any effects of a particular gate on the. photocharge packets will be subtracted by the differential output amplifier 317.

Figure 4:
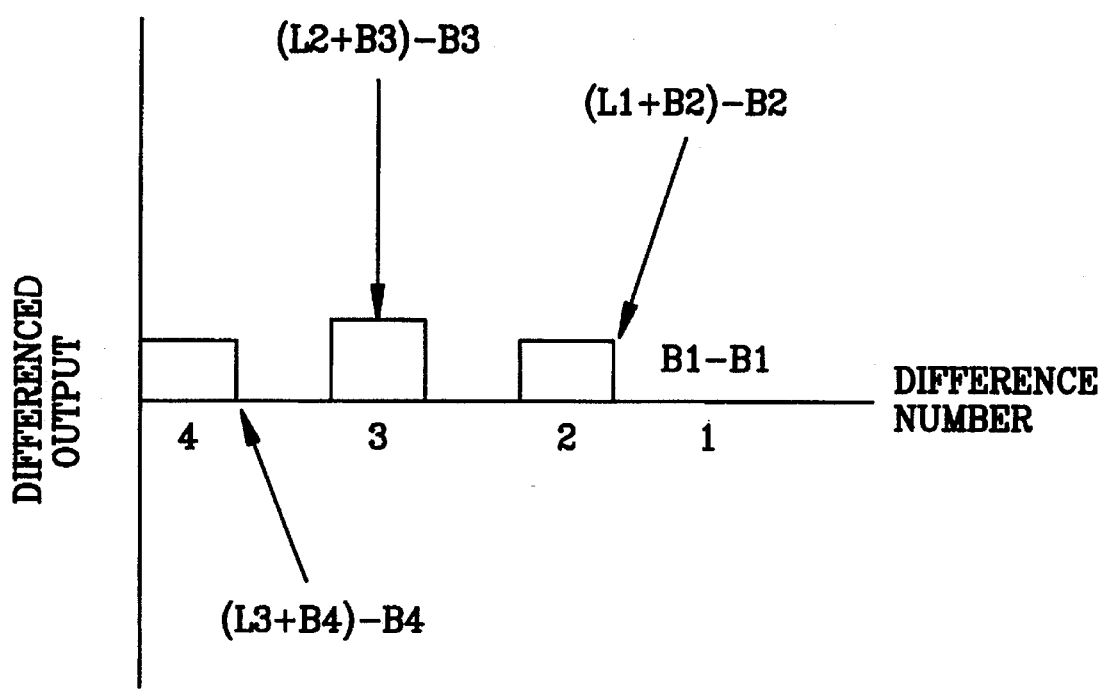
FIGS. 4 shows a differential output generated in accordance with an exemplary embodiment of the present invention.
Figure 5:
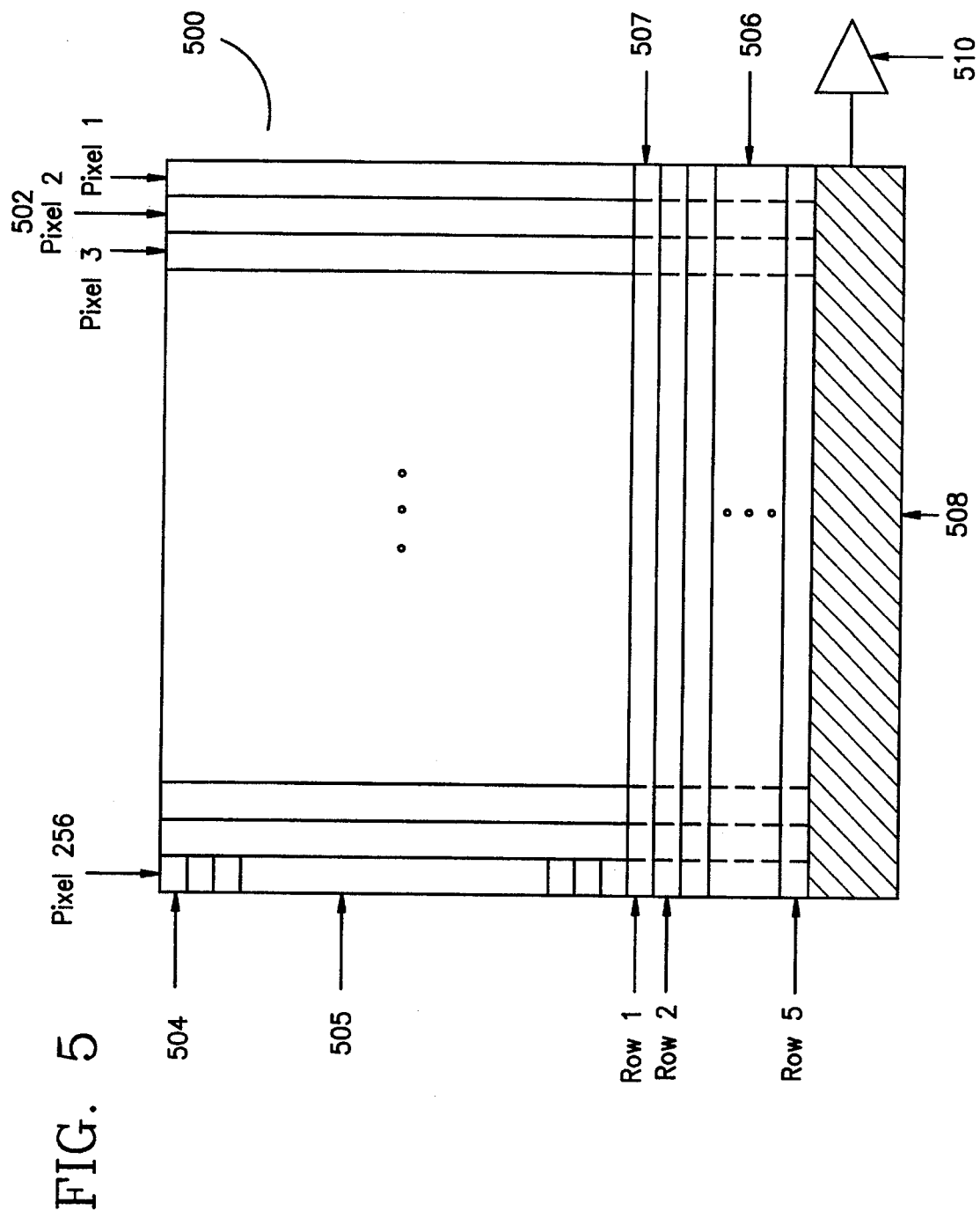
FIG. 5 shows an exemplary architecture of an imaging array formed as an integrated circuit in accordance with an exemplary embodiment of the present invention.

Those; skilled in the art will appreciate that the exemplary embodiments described above will provide accurate detection of an incident light signal associated with a laser pulse even in the presence of low signal-to-noise ratios. Thus, an output video signal will show a laser pulse in the presence of high background illumination regardless of whether the laser pulse is restricted to incidence on a single pixel or distributed across a plurality of pixels of the image sensor. Accuracy in detecting incident signal light therefore becomes more a function of the sensitivity of the detection electronics which are external to the charge-coupled device imaging array (e.g., subsequent electronic processing components such as analog-to-digital converters, sample and hold circuits and so forth), rather than a function of the accuracy of the detection scheme in the charge-coupled device imaging array. The foregoing is illustrated in FIG. 4 wherein detection of a light energy signal represented above a laser pulse distributed across plural pixels is illustrated. The signal of interest (e.g., a laser pulse of energy $L=L1+L2$) can accurately be detected using differential outputs 1–4 in a manner similar to that described with respect to FIG. 3o FIG. 5 illustrates a hardware implementation of a light energy detecting apparatus 500 in accordance with an exemplary embodiment of the present invention. The exemplary FIG. 5 architecture can be fabricated using, for example, three layers of polysilicon and two-metal n-type metal-oxide semiconductor buried channels in accordance with conventional charge-coupled device fabrication techniques (as further described in copending U.S. application Ser. No. (Attorney Docket No. 000401-104) filed Oct. 25, 1994, the disclosure of which is hereby incorporated by reference in its entirety). In the exemplary embodiment illustrated, each charge-coupled device is a linear array having 256 pixels, each of which can be segmented vertically into a plurality of photoelements (e.g., 125 individual interline transfer pixel elements 504 arranged along an axis orthogonal to a first axis along which 256 vertical columns of pixels 502 are formed). After an image is acquired in each interline transfer pixel element 504, the photocharge from all pixels in a given column 505 of interline transfer pixel elements can be binned in a storing means having a frame interline transfer architecture. The storing means can include a storage region 506 having any number of individual rows 507 of storage elements).

Thus, a laser pulse incident upon the image sensor results in acquired photocharge being accumulated in the interline transfer pixel elements 504 of each pixel 502 and binned into a second row of the storage region 506. In accordance with an exemplary embodiment, the storage region 506 can include 10 rows so that photocharge from five laser pulse detection frames and five background illumination frames can be acquired to perform five differential outputs for each pixel element. Photocharge stored in the storage region 506 can subsequently be transferred via the clocking means to a horizontal charge-coupled device 508 of the storing means, and then subsequently transferred to an on-chip output amplifier 510.

Figure 6:
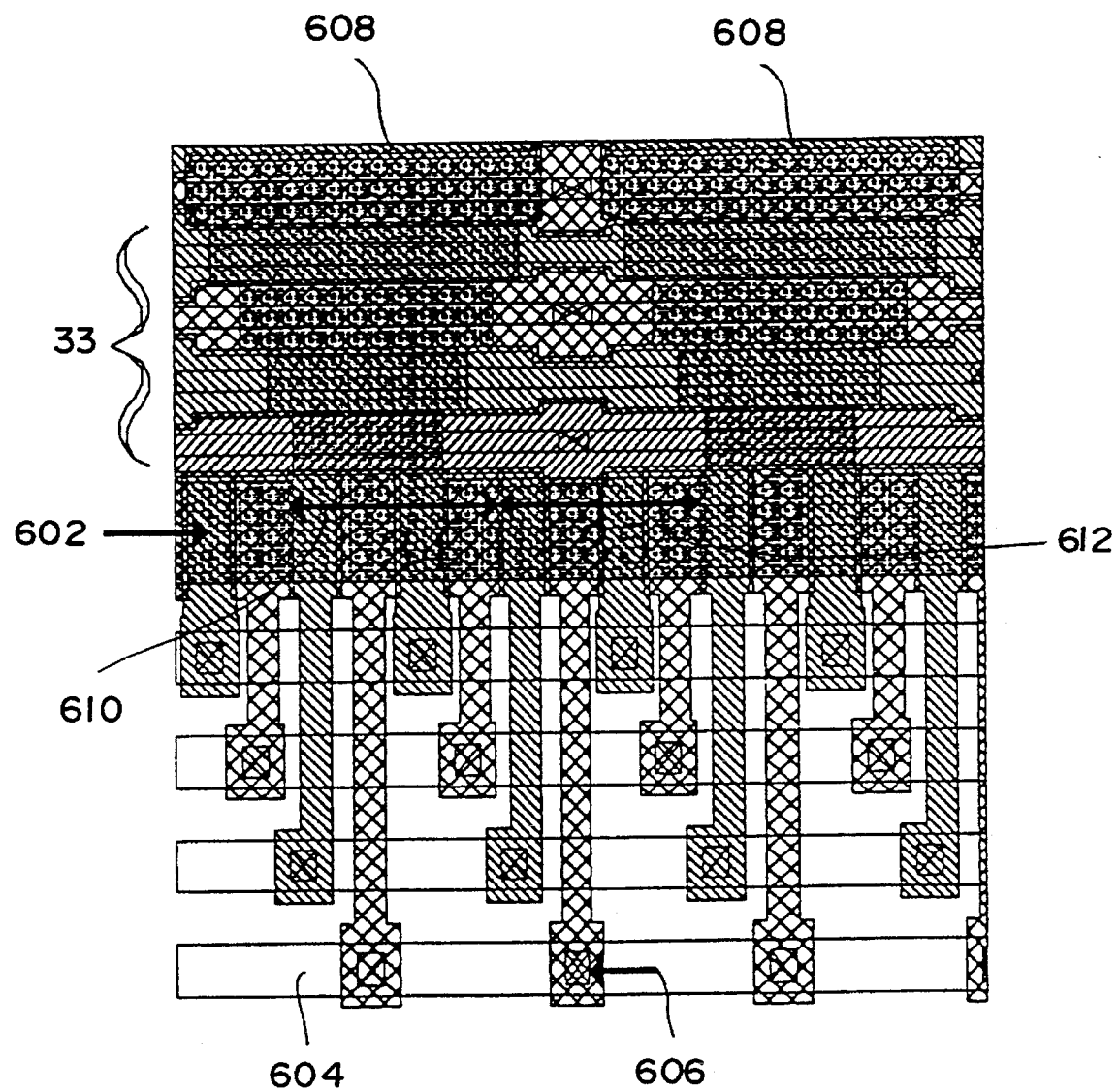
FIG. 6 shows a portion of a photocharge storage region and a horizontal charge-coupled device for photocharge read-out in accordance with the exemplary embodiment of FIG. 5.

FIG. 6 illustrates an exemplary embodiment of the horizontal charge-coupled device 508 and a portion of the storage region 506 of FIG. 5. In the exemplary FIG. 6 embodiment, the horizontal charge-coupled device is 4-phase, and includes polysilicon gates 602 fabricated on the first and second polysilicon layers of the three polysilicon layers. Clock signals of the clocking means can be directed to gates of the image sensor via busses 604 fabricated on a first layer of the metal. Connected to the polysilicon gates via contacts 606 beneath each storage element 608 (corresponding to an interline transfer pixel element) is a single horizontal charge-coupled device phase 610 (i.e., a set of independent charge-coupled device gates). Further, between adjacent storage elements 608 is a second horizontal charge-coupled device phase 612.

Thus, a first photocharge packet acquired at time t1 by a pixel which includes a laser pulse superimposed on a background illumination can be transferred into the single horizontal charge-coupled device stage 610 beneath the column of interline transfer pixel elements for a given pixel. Afterward, this photocharge can be laterally shifted from the first phase of the horizontal chargecoupled device 610 to the second phase 612 of the horizontal charge-coupled device. Either at the same time, or subsequent to such lateral shifting, a background illumination photocharge packet can be transferred into the first phase 610 of the horizontal charge-coupled device located beneath the storage region. Afterward, the first and second photocharge packets stored in the first and second stages of the horizontal charge-coupled device can be read to the on-chip output amplifier (i.e, formed on the same substrate as the image sensor) for differential combining.

Figure 7:
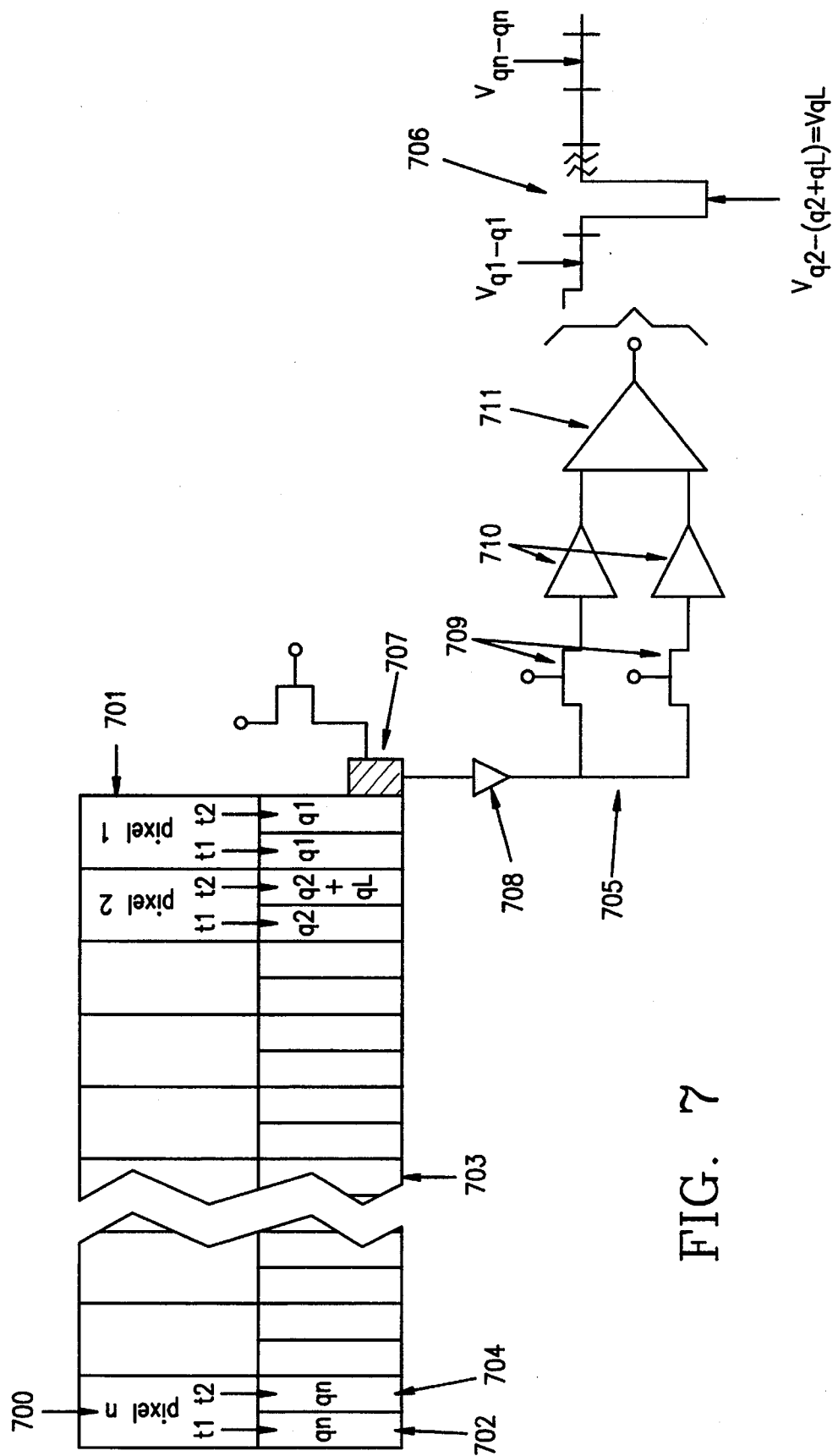
FIG. 7 illustrates an output region for the exemplary embodiment of FIGS. 5 and 6.

FIG. 7 illustrates an exemplary implementation of the invention for subtracting a background signal charge generated in one pixel during a first integration time from the background signal charge or background signal charge plus laser signal charge generated in the same pixel during another subsequent or preceding integration time. Individual pixels 700, labelled pixel 1 though pixel n, in the pixel array 701 integrate background signal charge $q1$ to $qn$, respectively, or background signal charge plus laser signal charge (qL) in each pixel during an integration period tl. The charge accumulated in pixel n during t1 is binned and transferred into one storage element 702 of a double density horizontal CCD shift register 703. In the FIG. 7 embodiment, a signal charge generated in pixel n during another integration period t2 is binned and transferred into a second storage element 704 of the double density horizonal CCD shift register. The signal charges q1 through qn generated during the two integration times t1 and t2, of equal length, are then shifted to output device 705, where the signal charge is converted to a voltage proportional to the value of the accumulated charge (i.e., voltage values $V_{q1}$ through $V_{qn}$.

Voltage signals representing the signal charge generated in the same pixel during the two integration periods are added differentially to produce a single video voltage waveform 706 which represents the differential sum of the two signals generated during the two integration times for each of the n pixels. If there is no laser signal present at any given pixel during either integration period, the video sum is zero. However, if the laser signal is present during one of the integration periods (such as is the case in pixel 2 during the second integration time t2), the resultant video waveform sum 706 is proportional to the charge generated from the laser signal only plus photon shot noise from the background and laser signals.

Signal charge is converted from charge to voltage at the resettable output node n+/p junction 707. A simple source/follower linear amplifier 708 can be used to condition the resultant video voltage signal 706.

One method of obtaining the differential sum in the FIG. 7 example relays the signal from the source/follower amplifier 708 to dual sample and hold circuits 709, which are clocked at ½ the frequency of the horizontal readout register, with a delay between the two sample and hold clocks of one horizontal clock cycle. The resultant video waveforms represent separate signals for each of the two integration times. The waveforms are then buffered by additional source/follower linear amplifiers 710 and input to separate nodes of a differential amplifier 711. The waveforms are summed in the differential amplifier to produce the signal waveform 706 representing the differential sum of the signal charge generated during integration times t1 and t2.

The two integration periods t1 and t2 are of equal duration and spaced by a time period which is negligibly small with respect to the overall integration period. The laser signal pulse is shorter in duration than the integration time and occurs during one of the integration periods° However, those skilled in the art will appreciate that any differential amplifier which can combine the photocharge stored in two storage elements of a charge-coupled device can be used in accordance with exemplary embodiments of the present invention.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. Apparatus for detecting a pulse of light energy comprising:

at least one pixel for accumulating a first photocharge at a first sample time, said at least one pixel also accumulating a second photocharge at a second sample time;

means for storing said first photocharge and said second photocharge;

means for differentially combining said first photocharge and said second photocharge to detect said pulse of light energy, said differentially combining means including at least two sample and hold circuits for sampling said first photocharge and said second photocharge respectively, at least one of said two sample and hold circuits being clocked at one-half a frequency at which said storing means is clocked; and a single substrate upon which said at least one pixel for accumulating said first photocharge, said at least one pixel for accumulating said second photocharge, said storing means and said differentially combining means are formed.

2. Apparatus according to claim 1, wherein said first sample time and said second sample time are of equal duration.

3. Apparatus according to claim 2, wherein said pulse of light energy is shorter in duration than said first sample time.

4. Apparatus according to claim 1, further including:

means for clocking said at least one pixel to transfer said first photocharge accumulated in said at least one pixel to a first stage of at least two stages of the storing means.

5. Apparatus according to claim 4, wherein said clocking means further includes:

means for clocking said storing means to transfer said first photocharge to a second stage of said at least two stages.

6. Apparatus according to claim 5, wherein said differentially combining means further includes:

an output for providing a voltage differential proportional to a difference between the first photocharge stored in said second stage of the storing means and a second photocharge stored in the first stage of said storing means.

7. Apparatus according to claim 6, further including:

an array of pixels formed along a first axis with a first pitch, said stages of said storing means being formed along the same axis with a second pitch equal to one-half of said first pitch.

8. Apparatus according to claim 6, further comprising:

an array of pixels formed along a first axis with a first pitch, said first stage of said storing means being included in a first array of stages formed along a second axis with said first pitch, and said second stage of said storing means being included in a second array of stages formed along a third axis with said first pitch.

9. Apparatus according to claim 6, further comprising:

an array of pixels formed along a first axis, each pixel in said array further including a plurality of individual photoelements arranged along an axis orthogonal to said first axis.

10. Apparatus according to claim 9, wherein said storing means includes:

a charge-coupled device having at least plural stages for storing photocharge from said at least one pixel.

11. A method for detecting pulsed light energy comprising the steps of:

accumulating a first photocharge in at least one pixel of a pixel array formed on a substrate;

transferring said first photocharge from said at least one pixel in said array of pixels to a first stage of a storage device formed on said substrate and having plural stages;

transferring said first photocharge from said first stage of said storage device to a second stage of said storage device; and combining, on said substrate, said first photocharge stored in said second stage with a second photocharge accumulated by said at least one pixel using a clock cycle having a frequency which corresponds to one-half a frequency at which said steps of transferring are performed, said step of combining further including a step of sampling and holding said first photocharge stored in said second stage, and sampling and holding said second photocharge to differentially combine said first photocharge and said second photocharge.

12. A method according to claim 11, wherein said step of transferring further includes the step of:

clocking the array of pixels to transfer the first photocharge to the first stage of the storage device;

clocking the storage device to transfer the first photocharge to the second stage of the storage device; and clocking the array of pixels to transfer the second photocharge to the first stage of the storage device.

13. Method according to claim 12, wherein said step of combining further includes the step of:

providing a voltage differential proportional to a difference between the first photocharge stored in the second stage of the storage device and the second photocharge stored in the first stage of the storage device, the first and second photocharges having been accumulated by said at least one pixel at separate sample times.

14. System for detecting an object using light energy comprising:

means for emitting a pulse of light energy;

means for detecting said pulse of light energy emitted from said emitting means, said detecting means further including:

at least one pixel for accumulating a first photocharge at a first sample time, said at least one pixel also accumulating a second photocharge at a second sample time;

means for storing said first photocharge and said second photocharge;

means for differentially combining said first photocharge and said second photocharge to detect said pulse of light energy, said differentially combining means including at least two sample and hold circuits for sampling said first photocharge and said second photocharge respectively, at least one of said two sample and hold circuits being clocked at one-half a frequency at which said storing means is clocked; and a single substrate upon which said at least one pixel for accumulating said first photocharge, said at least one pixel for accumulating said second photocharge, said storing means and said differentially combining means are formed.

15. System according to claim 14, wherein said light energy emitting means further includes:

a laser diode for emitting a monochromatic light pulse.

16. System according to claim 15, wherein said storing means includes:

a charge-coupled device having plural stages for storing photocharge from said at least one pixel.

* * * * *